United States Patent
Adelung et al.

(10) Patent No.: US 7,718,349 B2
(45) Date of Patent: May 18, 2010

(54) METHOD FOR PRODUCING SUBMICRON STRUCTURES

(75) Inventors: Rainer Adelung, Kiel (DE); Stefan Rehders, Schönkirchen (DE)

(73) Assignee: Christian-Albrechts-Universitaet Zu Kiel, Kiel (DE)

( * ) Notice: Subject to any disclaimer, the term of this patent is extended or adjusted under 35 U.S.C. 154(b) by 475 days.

(21) Appl. No.: 11/666,013

(22) PCT Filed: Oct. 17, 2005

(86) PCT No.: PCT/DE2005/001852

§ 371 (c)(1),
(2), (4) Date: Apr. 23, 2007

(87) PCT Pub. No.: WO2006/042519

PCT Pub. Date: Apr. 27, 2006

(65) Prior Publication Data

US 2008/0090181 A1    Apr. 17, 2008

(30) Foreign Application Priority Data

Oct. 22, 2004    (DE)    ........................ 10 2004 051 662

(51) Int. Cl.
*G03F 7/00*    (2006.01)
(52) U.S. Cl. .......................................... 430/313; 430/5
(58) Field of Classification Search ................. 430/311, 430/314, 313, 5
See application file for complete search history.

(56) References Cited

U.S. PATENT DOCUMENTS 4,525,919 A    7/1985    Fabian

2003/0186167 A1 *    10/2003    Johnson Jr et al. .......... 430/296

FOREIGN PATENT DOCUMENTS

RU    2 094 902    10/1997

OTHER PUBLICATIONS

Gorokhov et al., "Stress Generation and Relaxation in Passivating Films and Its New Application in Nanolitography", Materials Science Forum, vols. 185-188, pp. 129-141, 1995.

Prinz et al., "Free-Standing and Overgrown InGaAs/GaAs Nanotubes: Fabrication, Potential Applications", Inst. Phys. Conf. Ser. No. 166, Chapter 4, pp. 199-202, 1999.

Prinz et al., "Application of Controllable Crack Formation For Nanoelectronic Device Elements Fabrication", Inst. Phys. Conf. Ser. No. 155, Chapter 2, pp. 49-54, 1996.

(Continued)

*Primary Examiner*—Kathleen Duda
*Assistant Examiner*—Caleen O Sullivan
(74) *Attorney, Agent, or Firm*—Diederiks & Whitelaw, PLC

(57) ABSTRACT

The invention relates to a method for producing submicron structures using a shadow mask, whereby a material charge and/or energy charge occurs through the openings of the shadow mask. The method comprises the following steps: a film which is used as a shadow mask and which is made of a masking material is applied to the substrate, tears are produced in the film, the tears extending until the substrate, edge areas of the film arranged on the tears are detached thereby exposing the substrate and the material or the energy is applied to the substrate by the tears, also above the exposed edge area of the shadow mask film.

18 Claims, 4 Drawing Sheets

OTHER PUBLICATIONS

Adelung et al., "Strain-Controlled Growth of Nanowires Within Thin-Film Cracks", Nature Materials, vol. 3, pp. 375-379, Jun. 2004.

Kunz et al., "A Production Method For Aligned Nanowires on Arbitrary Materials", Materials Research Society Symp. Proc., vol. 818, pp. 139-144, 2004.

Saif et al., "Nano Wires by Self Assembly", Department of Mechanical and Industrial Engineering, University of Illinois at Urbana-Champaign, pp. 45-47, 2003.

* cited by examiner

METHOD FOR PRODUCING SUBMICRON STRUCTURES

CROSS-REFERENCE TO RELATED APPLICATIONS

This application represents a National Stage application of PCT/DE2005/001852 entitled "Method for Producing Submicron Structures" filed Oct. 17, 2005.

BACKGROUND OF THE INVENTION

The invention relates to the manufacture of submicron structures, in particular, to those of electronic components having dimensions lying between some nanometers and a few micrometers that exhibit component particles of submicron sizes (e.g. electrodes).

In its efforts to continuously decrease the sizes of integrated circuits and electronic components, research and development, in the mean time, turns its attention towards the physically smallest multicomponent structures. Such structures generally consist of a multitude of collections of material, arranged above and/or juxtaposed beside one another upon a substrate, whereby the dimension of such a collection lies in at least one dimension in the submicron range, say, thin layers, nano (sized) wires or quantum dots. The materials out of which the accumulations are formed vary from elemental metals through semi-conductors and metallic oxide ceramics up to organic compounds, e.g. functional or chemically stable polymers.

The precise arrangement of the various material components is essential for the predictability and reproducibility of the behavior of a submicron structure. If, for example, one now wants to arrange two electrically conductive nano wires—possibly made of different metals—in parallel, at a distance of a few 10 nanometers from one another on a substrate in order that a third metal—e.g. a dielectric material—can be inserted between these, then already misplacement of a couple of hundred metallic atoms could cause a short circuit and thus make the expensively produced structure unusable.

Here up until now, even the definitive arrangement of an individual nano wire has not long been a generally mastered art. Typical procedures that heretofore have been used distinguish themselves by their high costs, such as, for example, electron beam or photo lithography.

Nano wires (also quantum wires) exhibit typical lengths of some micrometers in connection with diameters in the nanometer range. Such wires offer the possibility of producing highly sensitive sensors, catalytically active surfaces or optically transparent electrical conductors.

The arranging or aligning of nano wires on a substrate is extremely difficult, since no suitable tools are available for a purpose-oriented manipulation of nano particles. Usual procedures for microstructuring, such as X-Ray lithography, fail in connection with quantum wires due to the fact that the required structural dimensions are distinctly smaller than the beam diameter, and the light cannot be focused without further ado. Many procedures, therefore, work towards self-organization of the metallic atoms or clusters upon the substrate, whereby the wires form by themselves. This can, however, be achieved only under very special conditions.

The ADELUNG, R et al, *nature materials,* Vol. 3, June 2004, p. 375-379 article describes a relatively simple method for placing a nano structure, in particular, a nano wire, upon a substrate, during which the nano wire follows a microscopic restructuring. For this purpose, the substrate is coated chemically in a wet state or by vapor deposition, e.g. with a brittle film of oxide or a polymer, and consequently, fissures are generated in this layer goal-specifically, that reach up to the substrate. For example, using vapor deposition, metallic atoms are finally placed onto the substrate with the fissured film, whereby wire formed collections of metal can build up directly on the substrate solely in the region of the fissure. If necessary, the film can be removed so that only these nano wires are left behind. Depending on the traced structure of the fissure, a nano wire network can thus also be produced, for example a rectangular lattice network.

The procedure presented in the above-mentioned article is indeed suitable for the simultaneous application of several materials, for example, for producing alloy wires made of element metals. If, however, one wants to create, as cited in the above-mentioned example, two metal wires, running parallel and electrically insulated from one another, then these, in accordance with the structural possibilities limited to the micro scale, will exhibit spacing of some 100 nanometers from one another.

A better proposal for producing immediately neighboring (juxtaposed) submicron structures using methods of microstructuring is given in U.S. Pat. No. 4,525,919. Here, the substrate is provided with a shadow mask and spattered with material at an angle against the normal (line) substrate. The shadow mask is realized through a hollow recess in one of the masking layers covering the substrate, whereby the free-lying substrate area is additionally shaded (shadow cast) by a second layer overlapping the first masking layer. The effective mask opening is thus smaller than the free-lying substrate area. Material input at an angle can only lead to a partial covering of the substrate. If the angle is altered, then regions of the "shadow space" on the substrate get covered. In particular, thus, separate nano wires running parallel can thus be obtained.

The problems of this procedure, indeed, lie in the necessary creation of the shadow mask. U.S. Pat. No. 4,525,919 provides for a combination of an epitactic growth of the mask and a selective etching in order to freely position the substrate in a (pre) defined area. Such measures are complicated to control, time-consuming and thus hardly suited for mass production.

SUMMARY OF THE INVENTION

It is, therefore, the objective of the invention to propose a procedure with which submicron structures can be produced according to the described concept of a shadow mask in a simplified manner.

The invention proceeds from the method of controlled fissure formation described in detail in the above-mentioned article, with which specific stencils (templates) can be produced for nano wires. In particular, the invention also lays bare all the advantages cited therein.

As a further development of the procedure described in this article, a masking material is used, in which fissures can be easily caused that adhere to the substrate weakly and which chiefly tends towards the formation of a tensile stress on the surface of the mask. This is somewhat the case when the individual particles of the mask layer at the boundary layer to the substrate are forced to assume a larger spacing than in the volume of the mask material. The mask layer, with the growing layer thickness, then, tends to shrink on the surface, if it is permitted to do so.

This has, however, the consequence that during the formation of a fissure up to the substrate, forces arise in the masking film that favor a partial rolling-up of the film in the immediate neighborhood of a fissure. If the adherence of the film on the substrate is not too high, then a sufficiently thick film can be loosened and lifted off (delamination) starting from the fissure. This occurs on both of the opposing film edges all along the fissure; however, it remains restricted to a nearby area around the fissure, i.e. the film can be lifted off only locally. Not only the extent of delamination, but also the width of the fissure can be controlled through the material parameters of the thin film, such as, for example, the thickness of the film, adherence and tension at the boundary areas. In this regard, a material can even be influenced in a specific manner, say through annealing or irradiation. As examples, amorphous carbon or annealed (thus embrittled), photo coating agent (PMMA) may be cited here.

It is suggested in accordance with the invention to utilize loosened-off film edges as the opening of a shadow mask, through which material and/or energy can be input, if necessary, at an angle, on to the just-released substrate.

BRIEF DESCRIPTION OF THE INVENTION

The invention is explained in detail below and further elucidated on the basis of an embodiment. The following figures serve for this purpose, wherein.

DETAILED DESCRIPTION OF THE INVENTION

Figure 1:
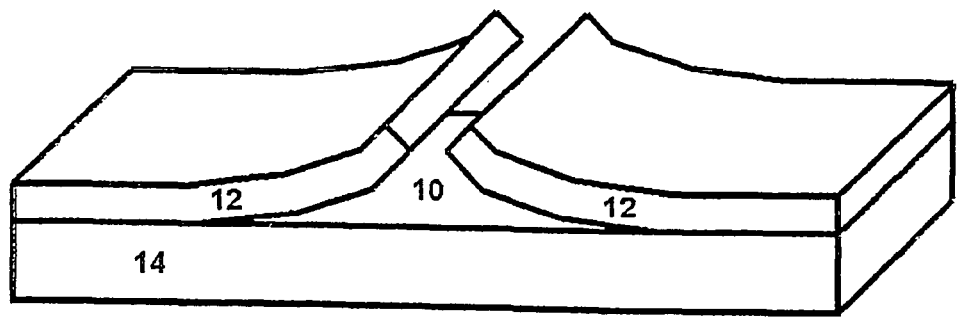
FIG. 1 shows a sketch of the shadow mask prepared under this invention for the manufacture of nano structures.

The controlled formation of the fissure in the masking layer with subsequent partial loosening of the layer leads, as illustrated in FIG. 1, directly to a shadow masking of the substrate. A relatively narrow lead aperture is formed at some distance to the substrate over a distinctly wider, exposed substrate surface. It is, thus, a special advantage of the procedure that the rolling masking film, among other things, adheres to and lifts off the impurities present on the surface of the substrate. The "working surface", on which the nano structures are to be created, exhibits, to a certain extent, the maximum cleanliness directly after the loosening off of the film and has ideal dimensions to produce extremely sharp edges, since the mask finds itself in the submicrometer range over the working surface.

Reference number 10 designates the hollow space for the structuring, reference character 12 the delaminated thin film, 14 the substrate.

Figure 2:
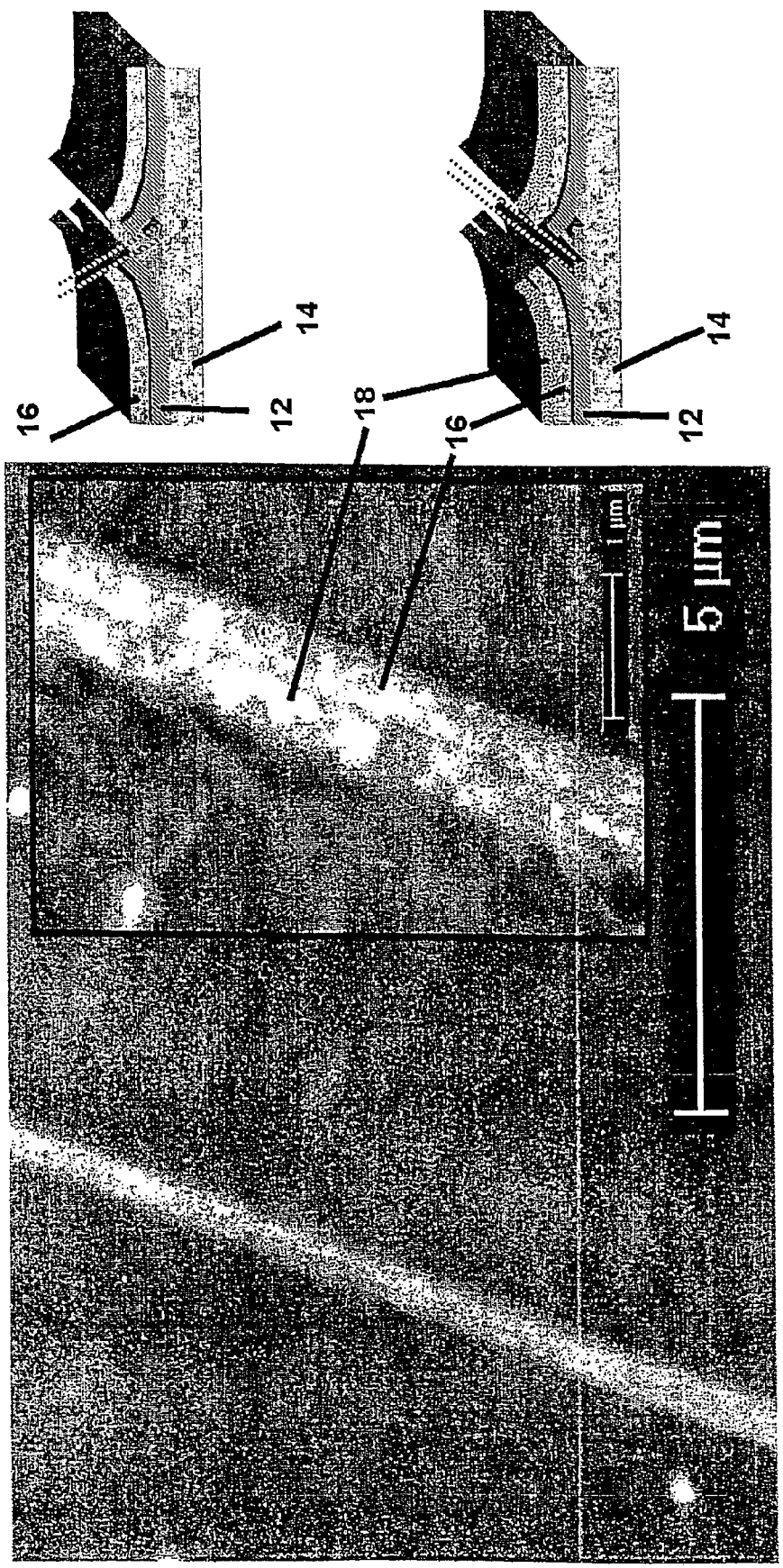
FIG. 2 shows the basic principle and an implemented example for nano wires running in parallel (scanning electron microscope photograph)

The shadow mask formed due to delamination permits the utilization of all well-known advantages of the shadow masking technique. In particular, different materials can be input either simultaneously or one after the other at variable angles, in order to produce mixed substances or those with gradients in the composition. Even the problem described at the outset of parallel and separated wires can be dealt with, as shown in FIG. 2. Two materials A and B are placed on the working surface one after the other under considerably varying input angles and leave, where necessary, an intervening gap uncovered. The scanning electron microscope photograph shows the generation of two, rather thicker wires.

It should be pointed out that in the schematic sketch of FIG. 2, a true-to-scale clarification was dispensed with. The masking layer lying below is normally very much thicker than, say, the material layers A and B that are formed during the generation of nano wire. Nevertheless, the deposition of additional materials on the already loosened film may cause the forces in the film causing the rolling up to change. Apart from the inadvertent changing of the shadow mask opening that needs to be taken into consideration, this state of affairs also naturally offers the possibility of regulating the diameter of the opening to a limited extent.

Reference number 16 designates the metal A, 18 the metal B (nano wires)

An example for this would be, say, the additional deposition of mask material upon the already loosened film in order to alter the opening at a later stage.

The controlling of the forces in the masking film should, however, preferably be planned in such a manner that the action of the force from outside upon the film can be directed in any desired manner and can be done without the additional input of material.

A simple possibility lies in adding magnetic particles to the masking materials that can be aligned in the applied film using an external magnetic field. When the opposing edges of the fissured film are, for example, made to impact magnetically against one another, then the shadow mask is opened out wider.

One can likewise add to the masking material particles that exhibit, upon power supply, a high thermal expansion or shrinking, or a change in expansion due to light, such as for example, the azobenzenes used in rewritable CDs. Here, it would be worthwhile to arrange them flatly spread out and selectively during masking in certain specific layers of the mask, in particular, on the surface. In case, for instance, primarily, the masked surface expands under illumination, the width of the opening of the shadow mask will once again diminish.

It should once again be emphasized that the procedure recommended here offers, in contrast to the shadow masking method using epitaxy and etching, the interesting possibility of closing, to the maximum extent possible, the opening of the shadow mask, since, in reality, no material is removed. Thus, it is in principle possible to achieve highly complex nano structures, say a series/row of broader wires next to one another on the substrate with the narrower contacts arranged upon it.

Figure 3:
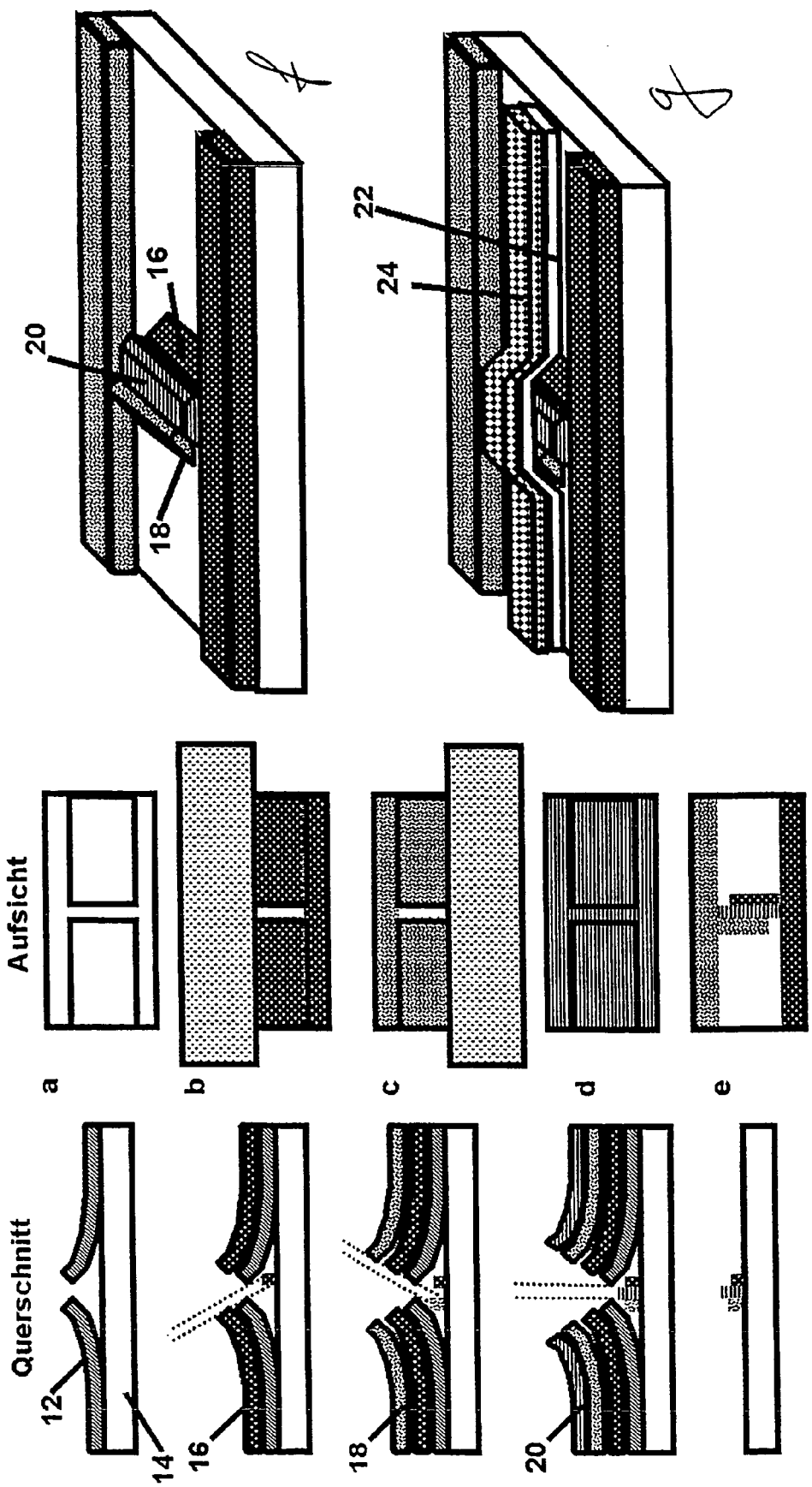
FIG. 3 shows a production/manufacturing concept for nano scale field effect transistors (Nano FET's) with the expedients of the invention.

A good example of a design for a more complex nano structure that can easily be produced in accordance with the procedure presented here is a nano-scale field effect transistor (Nano-FET). In the FIGS. 3a) to g) the individual steps of generation are sketched out:

FIG. 3a) shows the substrate and the masking film (here, with fissure and loosening) in lateral view and plan view. The plan view reveals that the film extends only over a central area of the substrate; the two substrate borders have remained free because of being covered during the application of the mask.

In FIGS. 3b) and c), one each of the substrate borders previously remaining free is covered with a temporary mask, and metal is placed on to the substrate through the shadow mask each at an angle. Parallel, separate wires are formed in the shadow area, of which each has electrical contact to one of the two metallized areas on the substrate border. These contact areas act as incoming lines to the nano wires, which can then be bonded using conventional techniques.

FIGS. 3d) and e) show the large surfaced placement of a semiconductor material 20 and the removal of the masking layer. The substrate remains behind with the border contacts, two nano wire-metallic electrodes ("Source" and "Drain") and a semiconductor nano wire lying between them, as shown in FIG. 3f).

The nano-FET is completed by firstly laying an insulator layer 22 across the nano wire arrangement and finally, a metallic layer 24 (not nano wire). The latter is the gate electrode, through whose potential the charge carrier density in the semiconductor wire is regulated.

Figure 4:
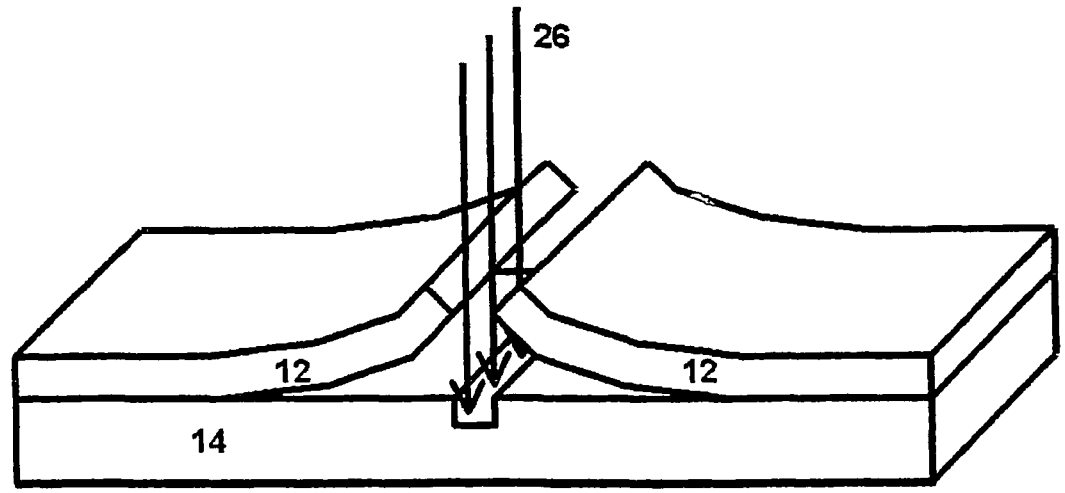
FIG. 4 shows the possibility of removing specific material from the substrate with the shadow mask

Finally, FIG. 4 shows another interesting variant of the generation of submicron structures with shadow masks. Using a beam of ions, parts of the substrate are loosened out through sputtering and there arise pit-like structures. Even here, the bombardment of ions can be done at predefined angles and for predefined durations, in order to control the morphology of the pits accurately. The masking layer must for this purpose, naturally, be immune to the beam of particles 26 (atoms; photons, electrons . . . ).

The technological potential for generating complex submicrostructures using shadow masks is distinctly evident from the examples given in the following, and this is more or less well known to the technical experts. Due to the manifold combination possibilities from materials, pit-like structures and precise contacts, apart from a nano-FET, many more components can be obtained at the boundaries of atomic scale sizes.

The expert also knows, however, that appropriate shadow masks have hitherto been made available only at a high cost and cannot (yet) be easily mass produced.

The present invention offers a remedy by teaching the promotion and systematic exploitation of an already existing effect, viz. the formation of fissures and loosening (peeling) of films, often regarded as disturbing phenomena.

Figure 5:
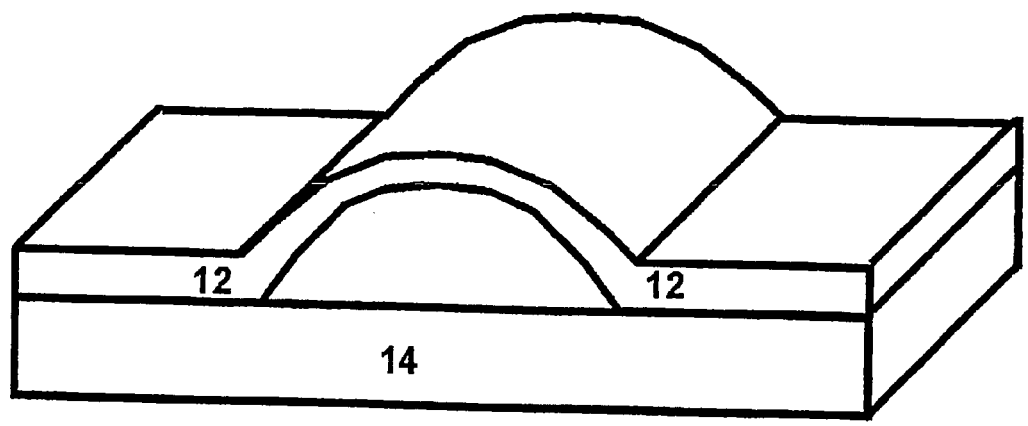
FIG. 5 shows an outline of the invention, wherein a) firstly, the masking film along predefined lines is loosened off and then b) due to the formation of the fissure along the bulge of the film, a shadow mask analogous to FIG. 1 arises.
Figure 5:
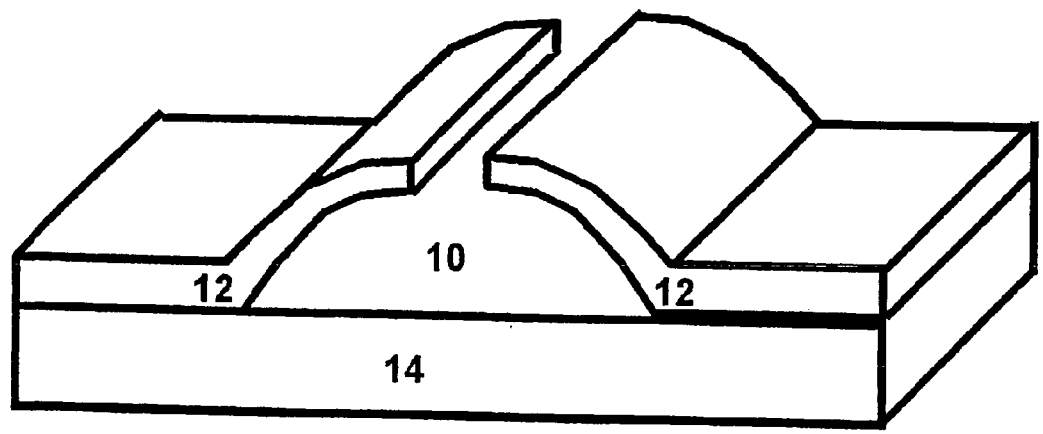

For the implementation of the procedure described here, it is necessary that a masking film that allows itself to be locally torn and then loosened off is placed on the substrate. However, the sequence of these (procedural) steps has no significance for the end result, as is elucidated by FIG. 5.

If the mask is applied on a substrate that is first heated (e.g. silicon, 150° C.) and then is subsequently quenched (e.g. through liquid nitrogen evaporation), archings will then form along the weakest points in the film, whereby the film gets simultaneously loosened off from the substrate (FIG. 5a). A highly brittle mask will give rise to fissures in the region of smallest radii of curvature already at the time of formation of the bulges, i.e. at the bulge's combs (FIG. 5b). Otherwise, one can also facilitate the formation of fissures, even after the loosening of the film, through additional tensile stress.

The progress of archings can, in principle, be regulated exactly like the progress of patterns of fissures through pre-structuring of the mask on the micro scale (see ADELUNG, R et al. *nature materials,* vol. 3, June 2004 p. 375-379 for examples).

The invention claimed is:

1. A method for producing submicron structures using a shadow mask, whereby a material and/or an energy input takes place through openings in the shadow mask according to the following steps:

applying a film made of masking material, serving as a shadow mask, directly to a substrate, creating fissures in the film that reach up to the substrate, loosening out border areas of the film in close proximity to the fissures, with the substrate being laid bare and inputting materials and/or energy through the openings on to the substrate laid bare, even beneath the loosened out border areas of the film.

2. The method according to claim 1 further comprising: adding particles to the masking material which can alter their geometry as a consequence of energy input.

3. The method according to claim 2, wherein a volume of the particles can be altered based on energy input.

4. The method according to claim 2, further comprising: inputting energy into the particles in the form of light.

5. The method according to claim 1, further comprising: adding magnetic particles to the masking material.

6. The method according to claim 1, further comprising: altering a width of one or more of the openings while providing a submicron structure.

7. The method according to claim 1, further comprising: establishing a controlled illumination of the film on the substrate.

8. The method according to claim 1, further comprising: subjecting the film in a region of the fissure to a controlled magnetic field.

9. The method according to claim 1, further comprising: having the film roll-up along the fissures.

10. A method of producing submicron structures comprising:

applying a film, made of a masking material, directly to a substrate;

producing tears in the film, with the tears extending to the substrate and edge portions of the film being detached from the substrate at the tears, thereby establishing exposed portions of the substrate; and applying material or energy to the exposed portions of the substrate.

11. The method according to claim 10, further comprising: adding particles to the masking material which can alter their geometry as a consequence of energy input.

12. The method according to claim 11, further comprising: inputting energy to alter a volume of the particles.

13. The method according to claim 12, further comprising: inputting energy into the particles in the form of light.

14. The method according to claim 10, further comprising: adding magnetic particles to the masking material.

15. The method according to claim 10, further comprising: altering a width of one or more of the tears while providing a submicron structure.

16. The method according to claim 10, further comprising: establishing a controlled illumination of the film on the substrate.

17. The method according to claim 10, further comprising: subjecting the film in a region of the tears to a controlled magnetic field.

18. The method according to claim 10, further comprising: having edge portions of the film roll-up at the tears.

* * * * *